(12) United States Patent
Chen et al.

(10) Patent No.: US 9,646,938 B2
(45) Date of Patent: *May 9, 2017

(54) INTEGRATED CIRCUIT WITH BACKSIDE STRUCTURES TO REDUCE SUBSTRATE WARP

(71) Applicant: Taiwan Semiconductor Manufacturing Co., Ltd., Hsin-Chu (TW)

(72) Inventors: Chih-Ming Chen, Hsinchu (TW); Szu-Yu Wang, Hsinchu (TW); Chung-Yi Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/881,365

(22) Filed: Oct. 13, 2015

(65) Prior Publication Data

US 2016/0035682 A1 Feb. 4, 2016

Related U.S. Application Data

(63) Continuation of application No. 13/925,940, filed on Jun. 25, 2013, now Pat. No. 9,184,041.

(51) Int. Cl.
*H01L 23/00* (2006.01)
*H01L 21/02* (2006.01)
(Continued)

(52) U.S. Cl.
CPC ...... *H01L 23/562* (2013.01); *H01L 21/02016* (2013.01); *H01L 21/302* (2013.01);
(Continued)

(58) Field of Classification Search
CPC .......... H01L 21/02016; H01L 21/8221; H01L 29/945
See application file for complete search history.

(56) References Cited

U.S. PATENT DOCUMENTS

| 5,905,298 | A | * | 5/1999 | Watatani | ............. | H01L 23/5222 |
| | | | | | | 257/295 |
| 6,444,524 | B1 | * | 9/2002 | Chung | ................ | H01L 21/3085 |
| | | | | | | 257/E21.234 |

(Continued)

FOREIGN PATENT DOCUMENTS

| CN | 102906866 A | 1/2013 |
| JP | 07-201971 A | 12/1993 |

OTHER PUBLICATIONS

English translation of Korean Office Action dated Jul. 29, 2015 for co-pending Korean Application No. 10-2014-0078408.

(Continued)

*Primary Examiner* — Yu-Hsi D Sun
(74) *Attorney, Agent, or Firm* — Eschweiler & Potashnik, LLC

(57) ABSTRACT

Wafer bowing induced by deep trench capacitors is ameliorated by structures formed on the reverse side of the wafer. The structures on the reverse side include tensile films. The films can be formed within trenches on the back side of the wafer, which enhances their effect. In some embodiments, the wafers are used to form 3D-IC devices. In some embodiments, the 3D-IC device includes a high voltage or high power circuit.

20 Claims, 14 Drawing Sheets

(51) Int. Cl.
*H01L 27/108* (2006.01)
*H01L 49/02* (2006.01)
*H01L 21/302* (2006.01)
*H01L 21/822* (2006.01)

(52) U.S. Cl.
CPC .. *H01L 27/10829* (2013.01); *H01L 27/10861* (2013.01); *H01L 28/60* (2013.01); *H01L 21/8221* (2013.01); *H01L 24/73* (2013.01); *H01L 2224/32145* (2013.01); *H01L 2224/32225* (2013.01); *H01L 2224/48227* (2013.01); *H01L 2224/73253* (2013.01); *H01L 2224/73265* (2013.01); *H01L 2924/15311* (2013.01); *H01L 2924/3511* (2013.01)

(56) References Cited

U.S. PATENT DOCUMENTS

| | | |
|---|---|---|
| 8,183,578 B2 | 5/2012 | Wang |
| 8,338,939 B2 | 12/2012 | Lin et al. |
| 2006/0051938 A1 | 3/2006 | Connell et al. |
| 2006/0115952 A1 | 6/2006 | Wu |
| 2010/0140812 A1 | 6/2010 | Fujii |
| 2010/0224876 A1 | 9/2010 | Zhu |
| 2011/0272762 A1 | 11/2011 | Booth et al. |
| 2012/0211865 A1 | 8/2012 | Tian et al. |
| 2012/0326309 A1 | 12/2012 | Andry et al. |
| 2014/0225231 A1* | 8/2014 | Gambino .............. H01L 23/562 257/629 |

OTHER PUBLICATIONS

Non-Final Office Action dated Feb. 6, 2015 for U.S. Appl. No. 13/925,940.

Notice of Allowance dated Jun. 25, 2015 for U.S. Appl. No. 13/925,940.

* cited by examiner

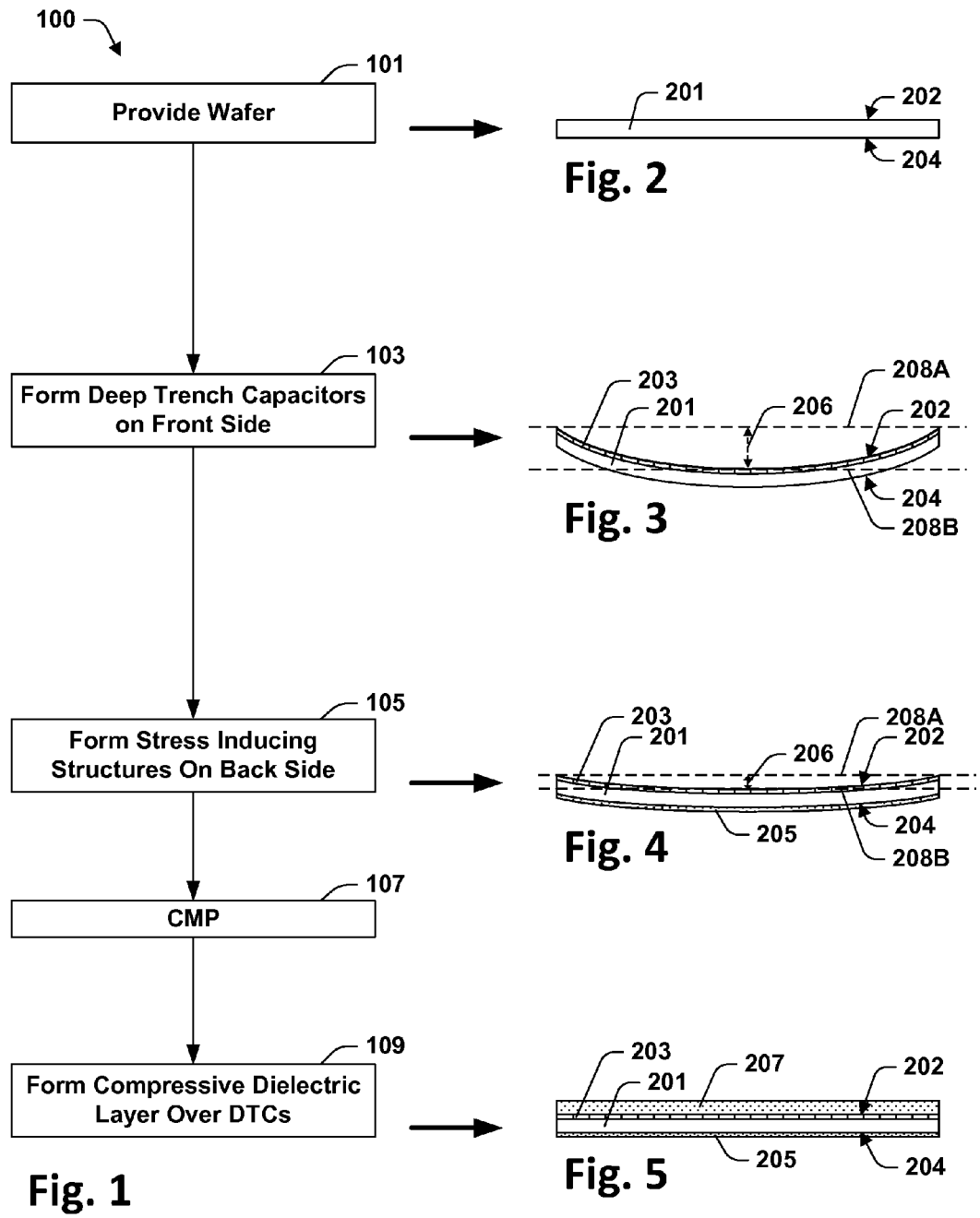

INTEGRATED CIRCUIT WITH BACKSIDE STRUCTURES TO REDUCE SUBSTRATE WARP

REFERENCE TO RELATED APPLICATION

This application is a Continuation of U.S. application Ser. No. 13/925,940, filed on Jun. 25, 2013, the contents of which are incorporated by reference in their entirety.

FIELD

The present disclosure relates to integrated circuit devices with backside structures to reduce warp.

BACKGROUND

Since the invention of the integrated circuit, the semiconductor industry has continuously sought to improve the density of integrated circuit components (transistors, diodes, resistors, capacitors, etc.). For the most part, improvements in density have come from reductions in feature size, allowing more components to be formed within a given area. These improvements have been made while components remain in an essentially two-dimensional layout. Although dramatic increases in density have been realized within the limits of a two-dimensional layout, further improvements are difficult to achieve.

Three-dimensional integrated circuits (3D ICs) have been created to overcome these limitations. In a 3D IC, two or more semiconductor bodies, each including an integrated circuit, are formed, aligned vertically, and bonded together. Another way to increase device density is through vertical device structures on individual wafers. Vertical structures can greatly reduce the surface area requirement for an integrated circuit (IC) device. Deep trench capacitors are one type of vertical device structure that has received attention. Deep trench capacitors can be used in various capacities, most notably in forming dynamic random access memory (DRAM).

BRIEF DESCRIPTION OF THE DRAWINGS

FIG. 1 is a flow chart for a process according to an embodiment of the present disclosure.

FIGS. 2-5 illustrate a wafer according to an embodiment of the present disclosure at various stages of processing according to the method of FIG. 1.

DETAILED DESCRIPTION

Figure 6:
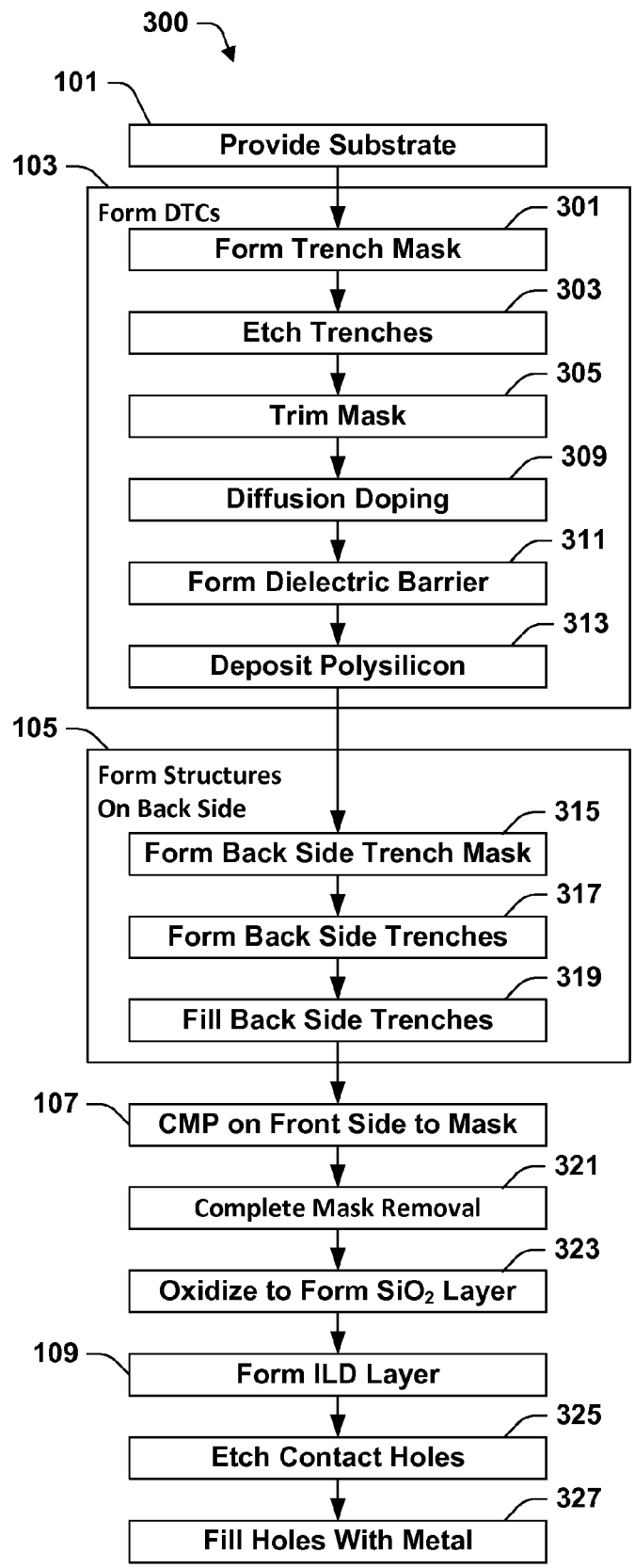
FIG. 6 is a flow chart for a process according to another embodiment of the present disclosure.

Over the course of manufacturing integrated circuit devices with deep trench capacitors, the wafer on which the capacitors are formed can become bowed. The inventors have observed that this bowing can be particularly severe for deep trench capacitors having multiple conductive layers. Bowing can proceed to an extent that adversely affects subsequent processes such as chemical mechanical polishing. Bowing can be particularly problematic for wafers that are being formed into 3D-IC devices.

The inventors solved this problem by forming structures having tensile stress on the back sides of wafers. In some embodiments, these structures are tensile films. In some embodiments, these structures include trenches filled with tensile material. The structures on the back side of the wafer reduce the wafer bow sufficiently to enable further processing. In some embodiments, bowing is further reducing by forming one or more compressive films over the capacitors on the front sides of the wafers.

FIG. 1 is a flow chart of an example process 100 provided by the present disclosure. FIGS. 2-5 illustrate a wafer 201 at various stages of the process 100. Process 100 begins with act 101, providing the wafer 201. At this stage, the wafer 201 is flat as illustrated by FIG. 2.

Process 100 proceeds with act 103, which forms deep trench capacitors 203 on the front face 202 of the wafer 201. The materials of the deep trench capacitors 203 are deposited at elevated temperatures and have coefficients of thermal expansion that differ from that of the wafer 201. As the wafer 201 cools, the materials filling the deep trench capacitors 203 shrink to a greater degree than the materials forming the wafer 201. Because the materials filling the deep trench capacitor 203 adhere to the wafer 201, the materials filling the deep trench capacitors 203 become tensile films or materials, meaning films or materials under tensile stress. These tensile stresses exert a compressive force on the front face 202 of the wafer 201. This force can cause the wafer 201 to bow as shown in FIG. 3.

The amount of bow 206 can be defined as the shortest distance between any two planes 208 bounding all points on the surface 202 of the wafer 201. In some embodiments, the deep trench capacitors 203 stress the wafer 201 sufficiently to strain the wafer 201 to a bow 206 greater than can be tolerated during subsequent processing absent structures to offset the bowing stress such as those provided by the present disclosure. In some embodiments, 150 µm is the maximum bow that can be tolerated during subsequent processing.

The process 100 proceeds with act 105, which is forming structures 205 having tensile stress on the back side 204 of the wafer 201. The structures 205 can counteract the stresses caused by deep trench capacitors 203 and reduce the bow 206 as shown in FIG. 4. While the structures 205 are shown in this example as being formed after the deep trench capacitors 203, in other embodiments the structures 205 can be formed wholly or in part before or simultaneously with the deep trench capacitors 203.

In some embodiments, the structures 205 produced by act 105 reduce the wafer bow 206 to less than 150 µm. In some embodiments, the structures 205 produced by act 105 exert a compressive force on the back side 204 of the wafer 201 having a magnitude that is at least 50% that of the compressive force exerted by deep trench capacitors 203 on the front face 202. In some embodiments, the structures 205 reduce the wafer bow 206 by at least 50%.

Process 100 proceeds with act 107, which is chemical mechanical polishing. Act 107 is illustrative of acts that can operate non-uniformly across the surface 202 to an unacceptable degree if the wafer 201 has an excessive bow 206. In some embodiments, these being the most typical, act 107 takes place during front-end-of-line (FEOL) processing and prior to back-end-of-line (BEOL) processing.

Process 100 can proceed with act 109, which is optional. Act 109 forms one or more optional compressive films 207 over deep trench capacitors 203. A compressive film is one that tends to shrinks after deposition (upon cooling) to a lesser degree than a structure to which the film adheres, whereby the film comes under compressive stress. The compressive films 207 can further balance the stresses induced by deep trench capacitors 203, and further reduce the wafer bow 206 as show in FIG. 5.

Act 109 can include controls to fine tune the stress balancing of act 109. In some embodiments, act 109 includes measuring the wafer bow 206 and using the measurement to determine the thickness of compressive films 207. A similar procedure can be made part of act 105 and used to determine the thickness or depth of structures 205. In some embodiments, act 109 reduces the wafer bow 206 to less than 20% of the bow that would be induced by deep trench capacitors 203 absent structures that offset the bowing stress such as the structures 205 and 207.

In some embodiments, one or more additional tensile films (not shown) are formed on the back side 204 of the wafer 201 in lieu of forming compressive films 207 on the front side of the wafer 201. In other embodiments, a combination of additional tensile films on the back side 204 and compressive films 207 on the front side 202 are used to achieve the stress balancing of act 109.

FIG. 6 provides a flow chart of a process 300, which is a more detailed example of a process within the scope of process 100. FIGS. 7-18 illustrate an example IC device 200 under manufacture by the process 300. The device 200 includes at least a portion of the wafer 201 and deep trench capacitors 203.

The first act 101 of the process 300 is providing a semiconductor substrate 201. The substrate 201 includes a semiconductor body. In some embodiments, the substrate 201 is formed from a single crystal of semiconductor. Examples of semiconductor bodies include, without limitation, silicon, silicon on insulator (SOI), Ge, SiC, GaAs, GaAlAs, InP, GaN, and SiGe. The semiconductor substrate 201 can include regions, structures, and devices that are not illustrated by the Figures and are formed by one or more steps that can take place before, overlapping with, or after the acts of the process 300.

In some embodiments, the semiconductor substrate 201 is a wafer of semiconductor. The wafer 201 can have a diameter of 300 mm or less, which is currently typical within the semiconductor industry. In some other embodiments, however, the wafer 201 has a diameter greater than 300 mm, e.g., 450 mm. Processes and structures of the present disclosure are particularly useful for these larger diameter wafers because of their greater susceptibility to warping.

Figure 7:
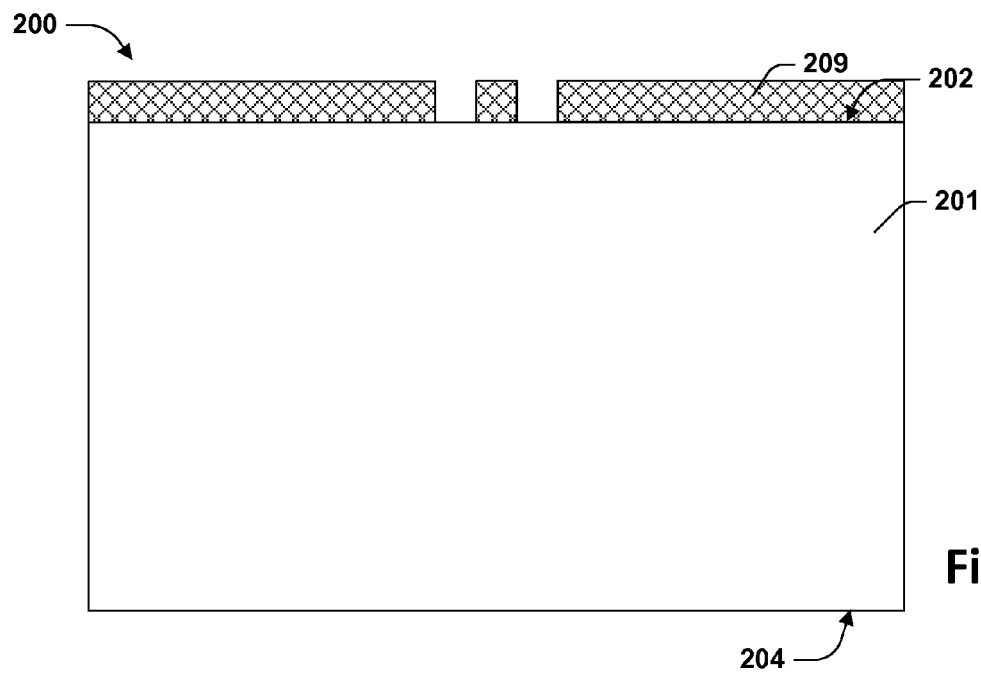
FIGS. 7-18 illustrate an integrated circuit device according to an embodiment of the present disclosure at various stages of processing according to the method of FIG. 6.

The process 300 continues with a series of acts 103 that form deep trench capacitors 203. Act 301 is forming a patterned mask 209 on the front face 202 of the semiconductor substrate 201 as shown in FIG. 7. The mask 209 can include one or more layers. Any suitable material or combination of materials can be used. The mask 209 is typically a hard mask patterned by lithography using a photoresist (not shown) patterned by a process that includes exposure through a photolithography mask (also not shown). The hard mask material can be silicon dioxide. Examples of other materials that may be suitable for the hard mask 209 include without limitation, silicon nitride and SiON. The mask layer 209 can be formed by any suitable process or combination of processes.

Figure 8:
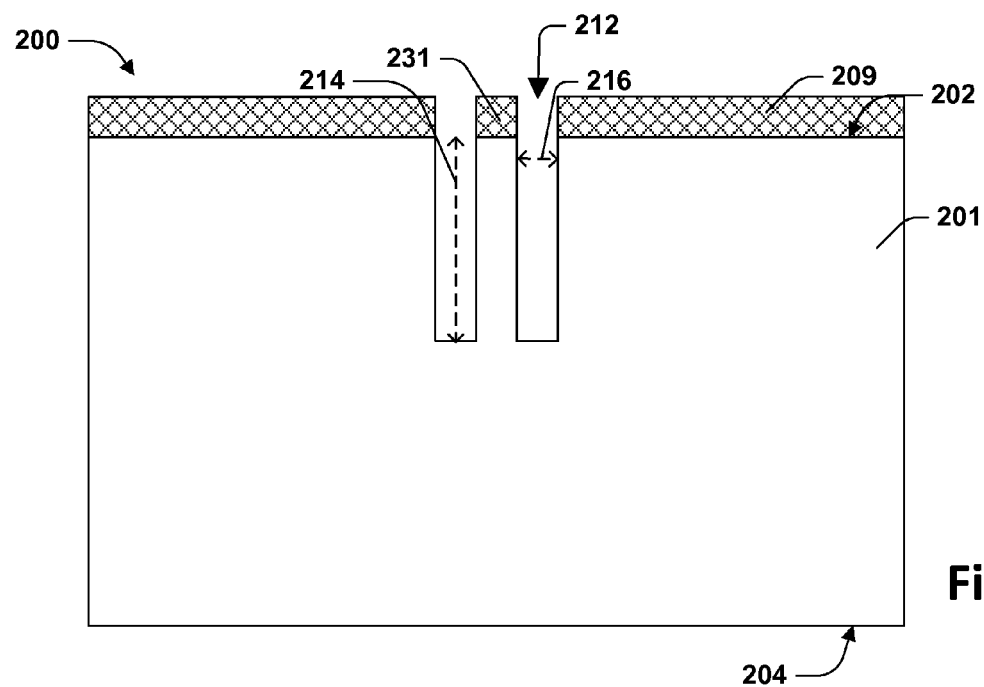

Act 303 is forming trenches 212 by etching the semiconductor substrate 201 through the mask 209 as shown in FIG. 8. Any suitable etch process can be used. A suitable etch process is typically a plasma etch. In most embodiments trenches 212 have a high aspect ratio. A high aspect ratio is a depth 214 to width 216 ratio of 10:1 or more. In some embodiments, the trenches 212 have aspect ratios in the range from 20:1 to 50:1. In some embodiments, the depths 214 are in the range from 500 to 10,000 nm. In most embodiments, the widths 216 are in the range from about 28 to 500 nm. In some embodiments, the widths 216 are in the range from 50 to 200 nm.

In most embodiments there are a large number of trenches 212 that are evenly spaced and parallel. A large number can be a number greater than 10, Typically, the number is greater than 100. Adjacent pairs of trenches 212 are considered parallel if the distance between the trenches 212 remains approximately constant over a length of the trenches 212 that is one or more orders of magnitude greater than the trench widths 216.

Figure 9:
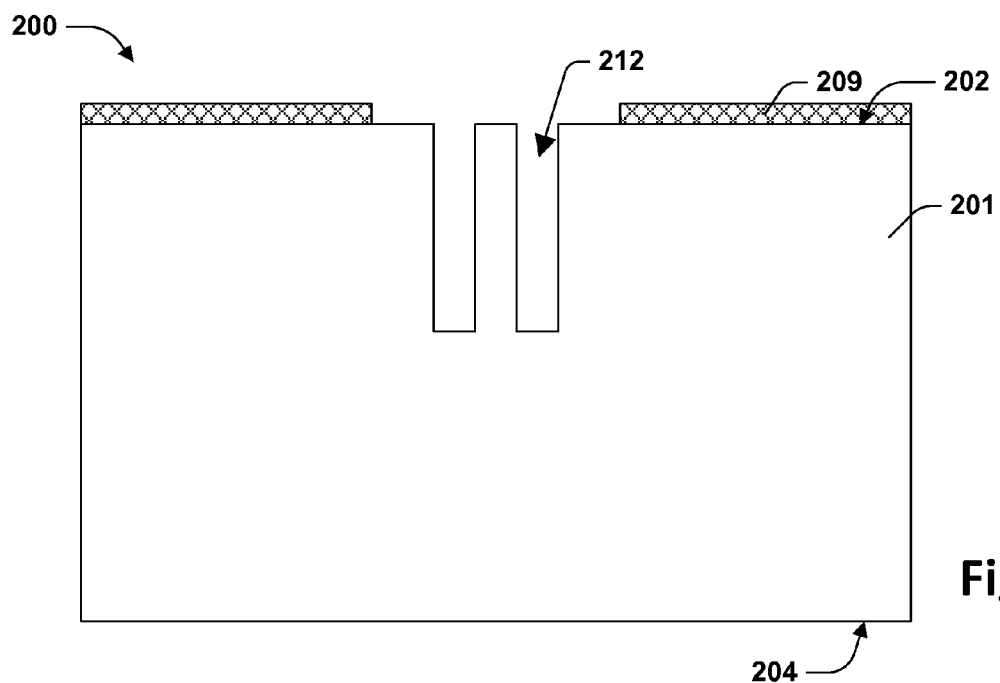

Act 305 is a trimming process that removes a portion 231 of the mask 209 between adjacent trenches 212 as shown in FIGS. 8 and 9. In some embodiments, act 305 is an etch process that uses a photoresist mask. In some other embodiments, act 305 is a maskless etch that preferentially removes the mask 209 at locations 231. Preferential etching at location 231 can be achieved by using a lateral or isotropic etch process that takes advantage of the greater surface to volume of the mask 209 at locations 231 as compared to portions of the mask 209 that are further from trenches 212. A maskless etch process can be a wet etch.

Figure 10:
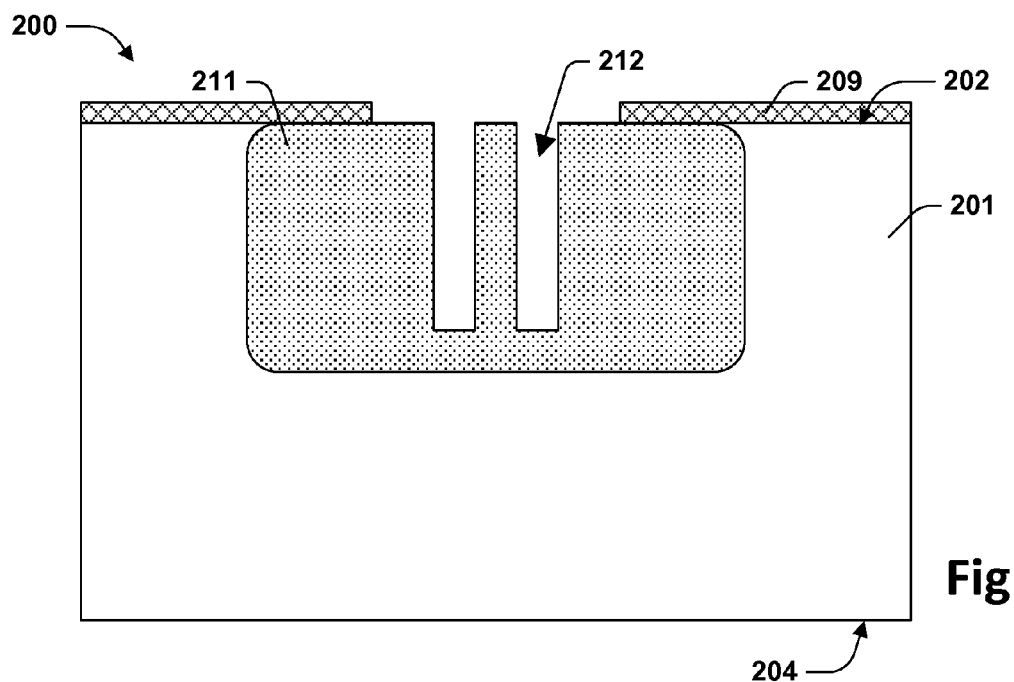

Act 309 is doping the substrate 201 in the vicinity of trenches 212 to form a conductive well 211 as shown in FIG. 10. The doping can be n-type or p-type. Any suitable doping process can be used. A typical doping process for act 307 is a diffusion doping process. For example, the semiconductor 201 can be doped with phosphorous by exposing the heated substrate 201 to $POCl_3$ vapor.

Act 311 lines trenches 212 with a dielectric barrier 213. The barrier 213 can be formed from one or more layers of any suitable dielectric(s). A typical structure for the barrier 213 includes two or more layers. Typical materials for these layers include $SiO_2$, SiON, and SiN. Other examples of material that can be used for the dielectric barrier 213 include, without limitation, $Ta_2O$, $Al_2O_3$, and high-k dielectrics. The dielectric barrier 213 can be formed by any suitable process or combination of processes. An initial step can be deglazing to remove oxides formed on the sidewalls of the trenches 212 during prior processing.

Figure 11:
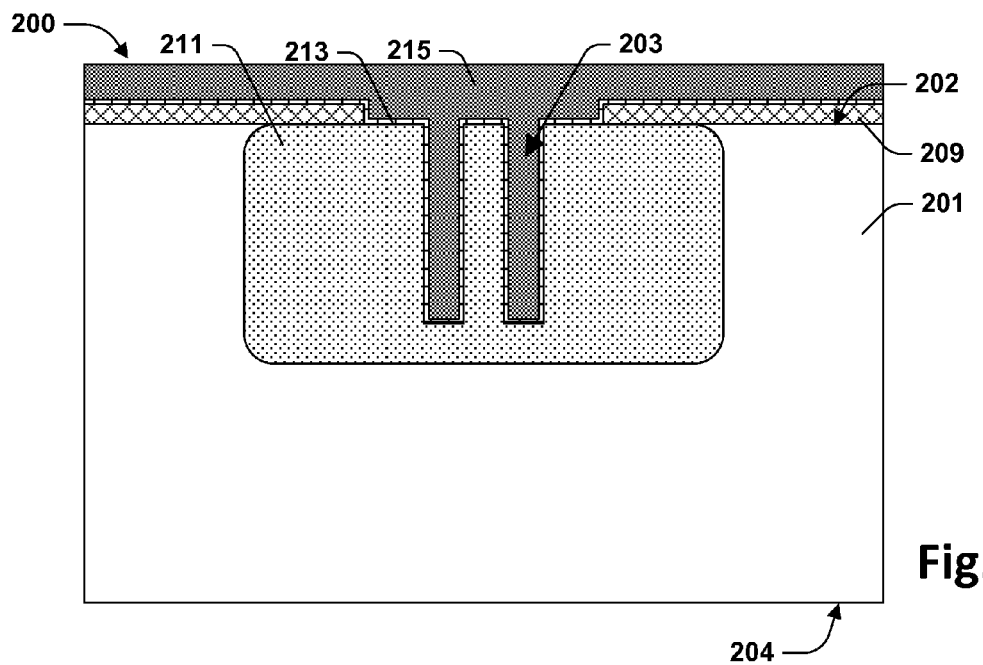

Act 313 is depositing conductive material 215 to fills the trenches 212 and form capacitors 203 as shown in FIG. 11. The conductive material 215 also forms over the mask 209 and within opening in the mask layer 209. The material 215 can be any suitable conductive material and can include multiple layers of various conductive materials. Examples of conductive materials that can be used include doped semiconductors, metals, and metallic compounds. The conductive material 215 can be deposited by any suitable process or combination of processes. In some embodiments, the conductive material 215 is polysilicon.

Following act 313, it is generally desirable to apply chemical mechanical polishing to remove the conductive material 215 from where it lies above the mask 209. However, the warp 206 may, at this stage of processing, interfere with that polishing. Act 105 is a series of acts that form structures 205 on the back side 204 of the substrate 201 to reduce the warp 206.

Figure 12:
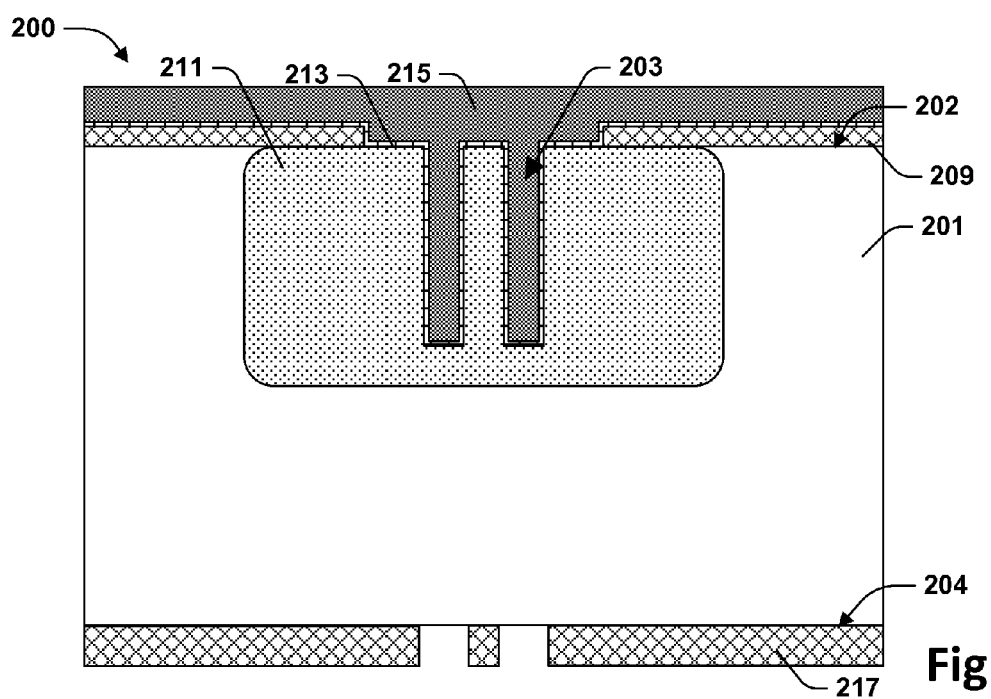
Figure 13:
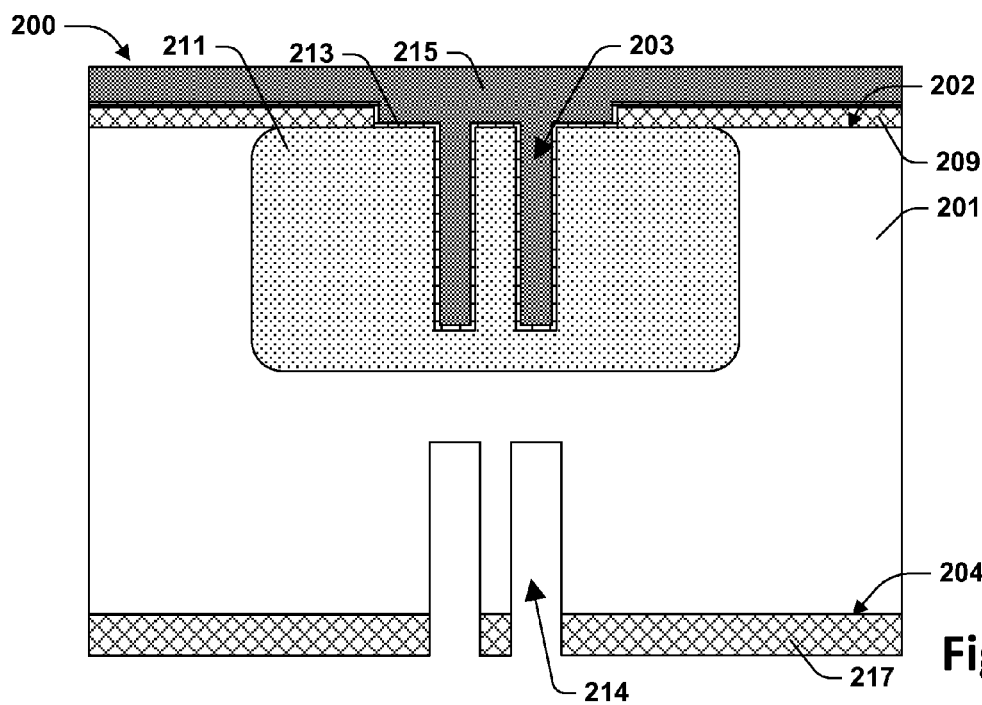
Figure 14:
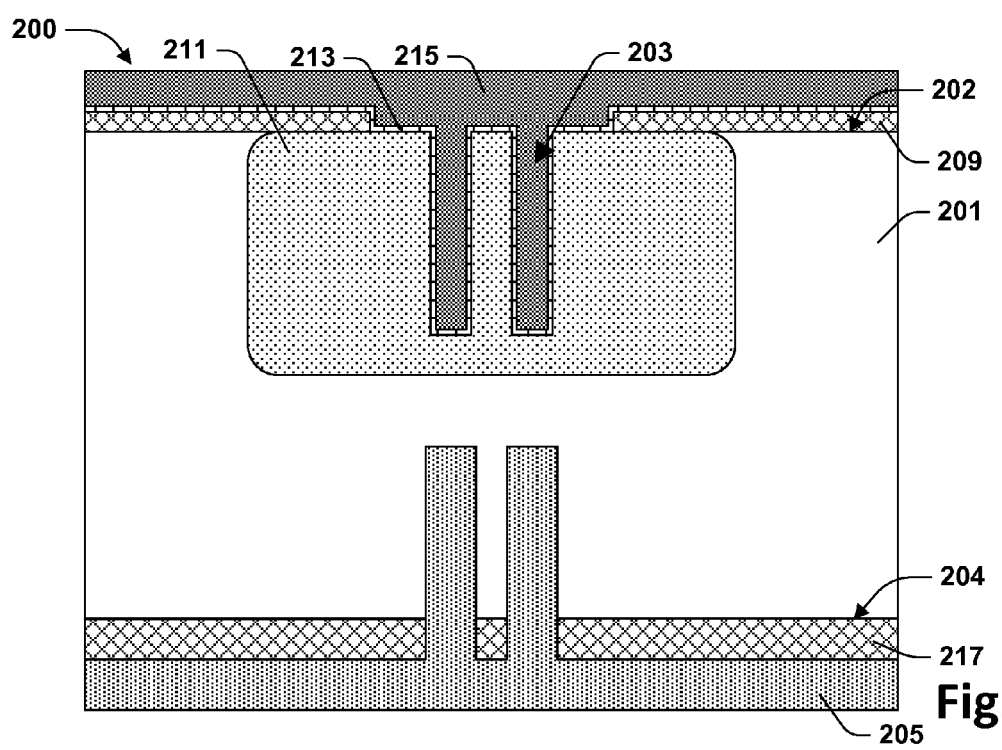

In the process 300, act 105 begins with act 315, forming a mask 217 on the back side 204 of the substrate 201 as shown in FIG. 12. Act 317 forms trenches 214 in the back side 204 as shown in FIG. 13 by etching the substrate 201 through openings in the mask 209. Act 319 fills the trenches 214 with a tensile material to form the structure 205 as shown in FIG. 14.

In some embodiments, act 317 sets the pattern for the trenches 214 using a photolithography mask that is the same mask used to pattern the trenches 212 in which deep trench capacitors 203 are formed. An advantage of these embodiments is that trenches 214 can be formed without an additional mask. These embodiments result in devices in which the pattern of the trenches 214 corresponds to the pattern of the trenches 212. In some embodiments, while the trenches 214 have the same pattern as the trenches 212, these two sets of trenches have a difference in depth. The difference in depths can be selected to better balance the backside stresses to the front side stresses on the wafer 201. In some embodiments, a depth for the trenches 214 is selected based on a measurement of the bow 206.

In most embodiments, the tensile material of structure 205 is a material having a larger coefficient of thermal expansion than that of the material of semiconductor substrate 201 to which the tensile material adheres. As the materials of substrate 201 and structures 205 cool following deposition, the material of structure 205 contracts more than the material of the substrate 201, which places a compressive force on the substrate 201 adjacent its back side 204. This force counters the force exerted by capacitors 203 on the substrate 201 adjacent its front face 202, and thereby reduces the warp 206.

Forming trenches 214 prior to depositing the material that becomes the tensile film of structure 205 can greatly increase the amount of stress that the structure 205 exerts on the substrate 201. Nevertheless, in some embodiments the trenches 214 are not formed. Not forming the trenches 214 simplifies the process 300, however, a greater thickness of the material of structure 205 is then required to provide an equivalent amount of stress on the back side 204 of the substrate 201. Moreover, the maximum stress that can be exerted by the structure 205 on the substrate 201 is generally less if trenches 214 are not formed.

While the dimensions of trenches 212 are selected in view of the desired properties for capacitors 203, the dimensions for trenches 214 are not similarly constrained. Accordingly, the trenches 214 can be different from the trenches 212 in terms of one or more of width, depth, density, and area spanned. In general, the stress exerted increases with trench pattern density. Accordingly, in some embodiments the trenches 214 have a higher pattern density then the trenches 212, e.g., 15% and 23% respectively. In some embodiments, the trenches 214 have a lower aspect ratio (depth to width) than the trenches 212. The lower aspect ratio facilitates processing.

Figure 15:
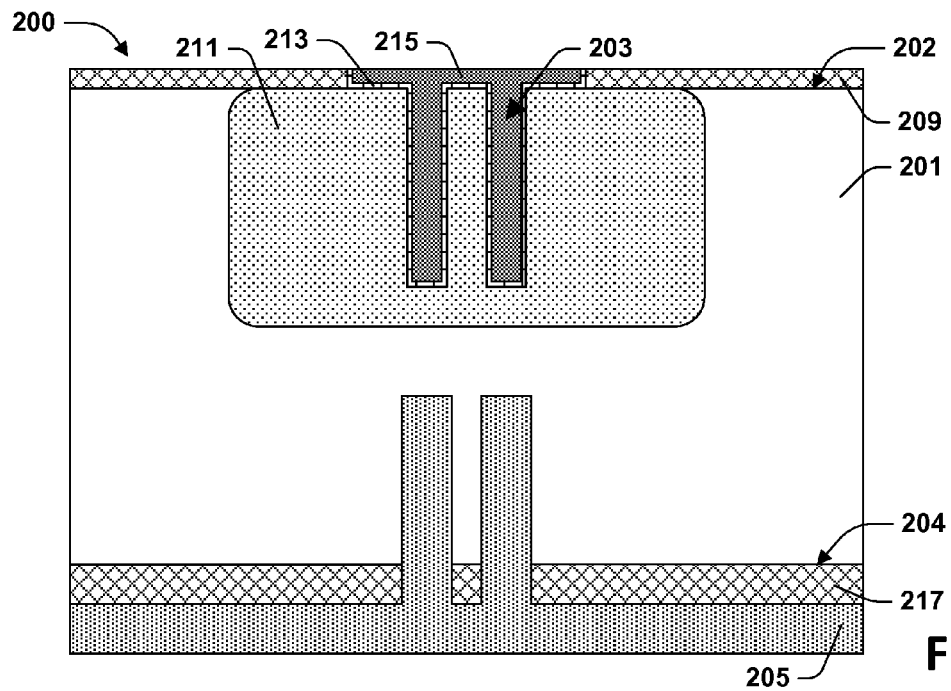
Figure 16:
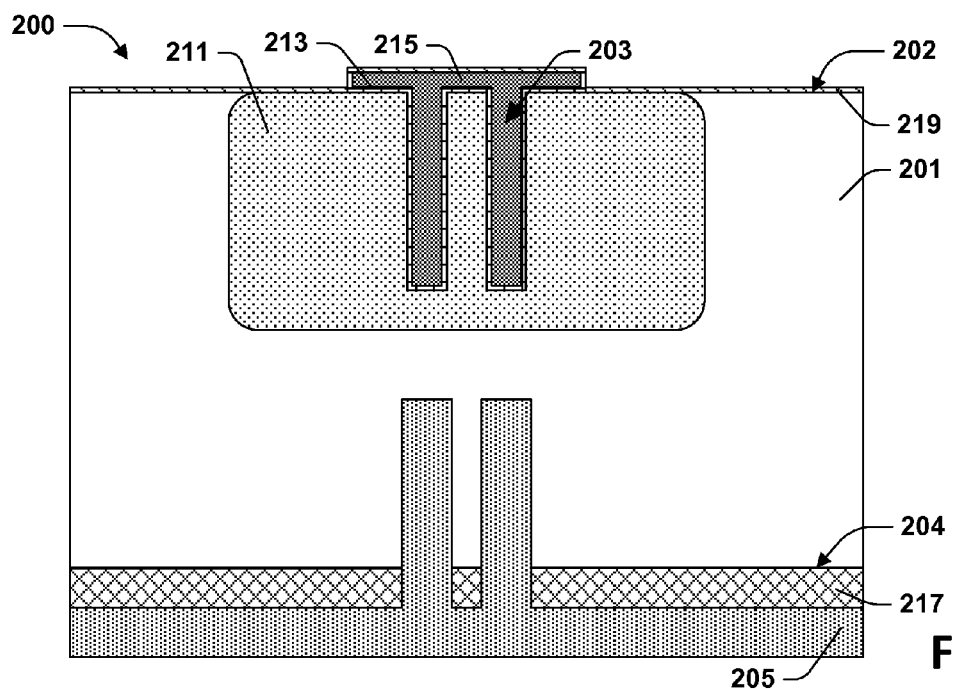

After forming the structure 205 by acts 105, the process 300 proceed with act 107, which is a planarization process, generally chemical mechanical polishing. For the device 200, act 107 removes the conductive material 215 from where it lies outside of openings in the mask 209 to produce a structure as shown in FIG. 15. The process 300 can proceed with additional actions such as act 321, removing the remaining portion of mask 209 and act 323, oxidizing to form dielectric barrier layer 219 as shown in FIG. 16.

Figure 17:
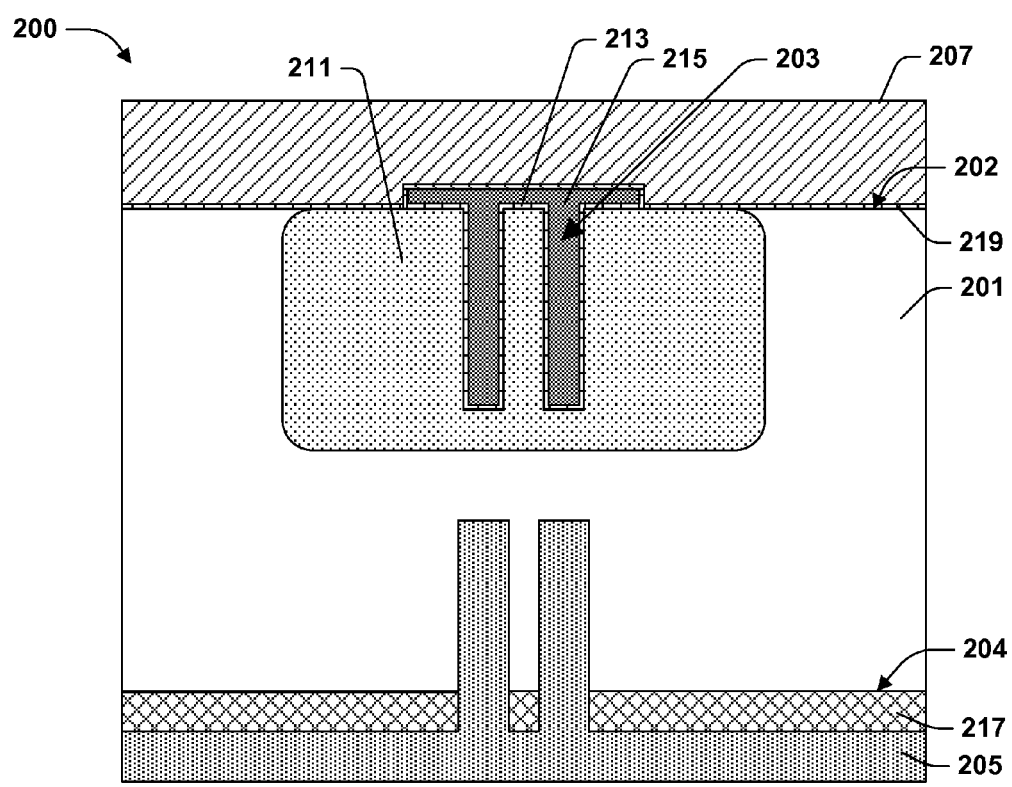

The process 300 can continue with additional steps, including BEOL processing. In some embodiments, the continuation includes the action 109, which forms a compressive film 207 above DTCs 203 as shown in FIG. 17. In some embodiments, the compressive film 207 is an inter-level dielectric (ILD) layer, but the film 207 can be any of the layers formed over the DTCs 203.'

Figure 18:
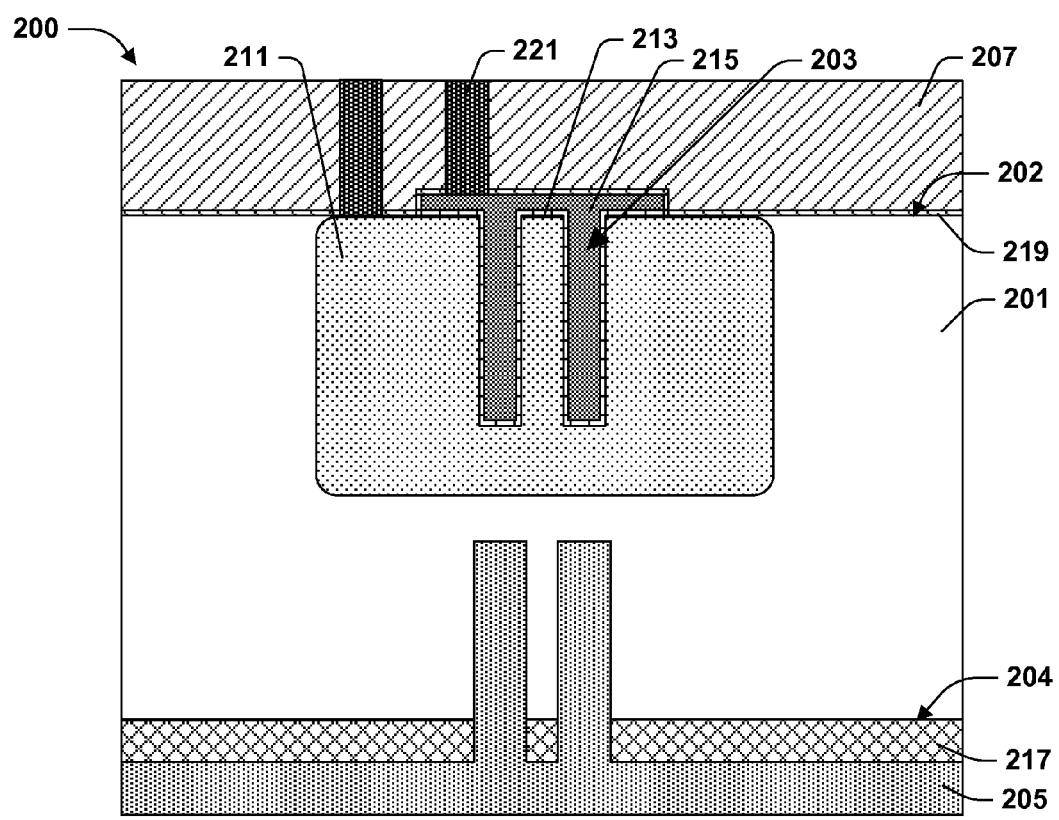

In most embodiments, the compressive film 207 is formed form a material having a smaller coefficient of thermal expansion than that of the material of the substrate 201 at its front face 202. As the substrate 201 and the film 207 cool following deposition, the material of the film 207 contracts to a lesser extent than the material of the substrate 201 and exerts a the front face 202 of the substrate 201. This force counters the force exerted by capacitors 203 on the substrate 201 and thereby further reduces the warp 206. The process 300 generally continues with act 325, which forms holes for contacts in the ILD layer 207 and act 327, filling the holes with conductive material to form contacts 221 as illustrated in FIG. 18.

The process 300 as shown in FIG. 6 and the device 200 as shown in FIGS. 7-18 illustrate only one type of deep trench capacitor 203. In general, the concepts of the present disclosure are applicable with any type of deep trench capacitor. The methods and structures of the present disclosure are particularly suited to integrated circuit devices having deep trench capacitors that include two or more conductive layers. In some embodiments DTCs 203 have two conductive layers. The greater the number of conductive layers, the greater the stress. Accordingly, in some embodiments DTCs 203 have three conductive layers.

Figure 19:
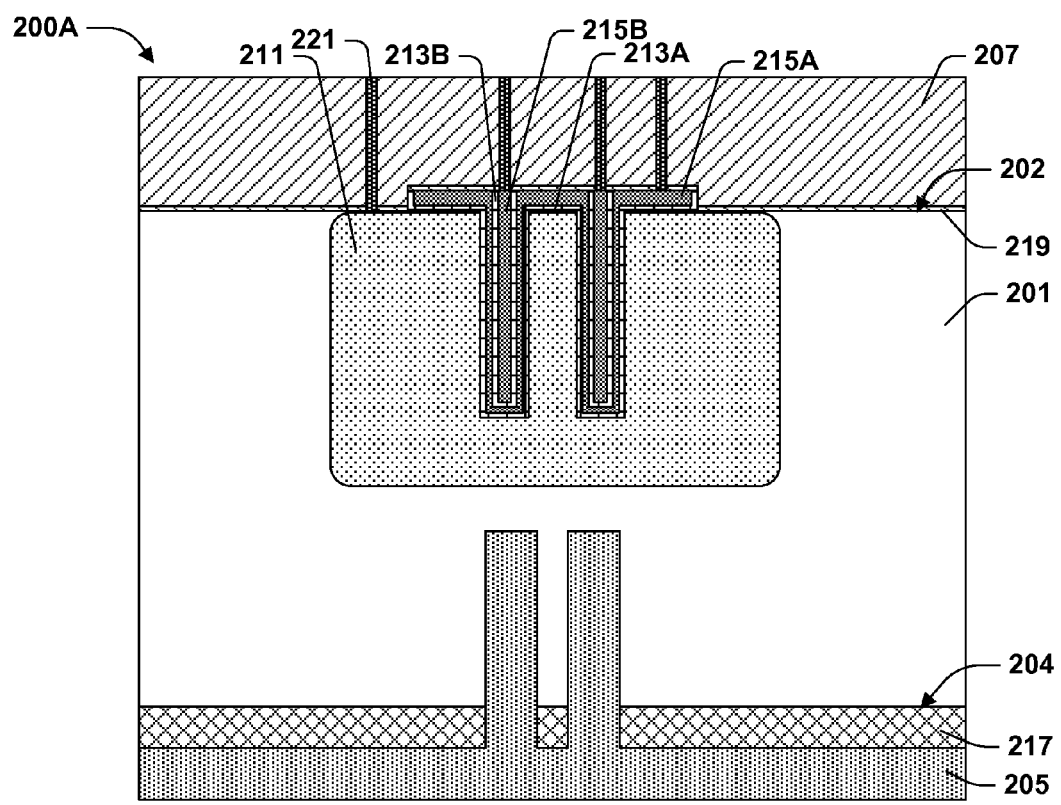
FIGS. 19-21 illustrate integrated circuit devices according to various alternate embodiments of the present disclosure.

FIG. 19 illustrates a device 200A, which is an example of a device 200 employing deep trench capacitors 203A having a two conductive layer structure. The capacitors 203A include first dielectric layer 213A, first conductive layer 215A, second dielectric layer 213B, and second conductive layer 215B. These layers can have any suitable compositions as described previously for the dielectric layer 213 and the conductive layer 215. For example, the dielectric layers 213A and 213B can be an ONO multilayer structures and the conductive layers 215A and 215B can be doped polysilicon.

Figure 20:
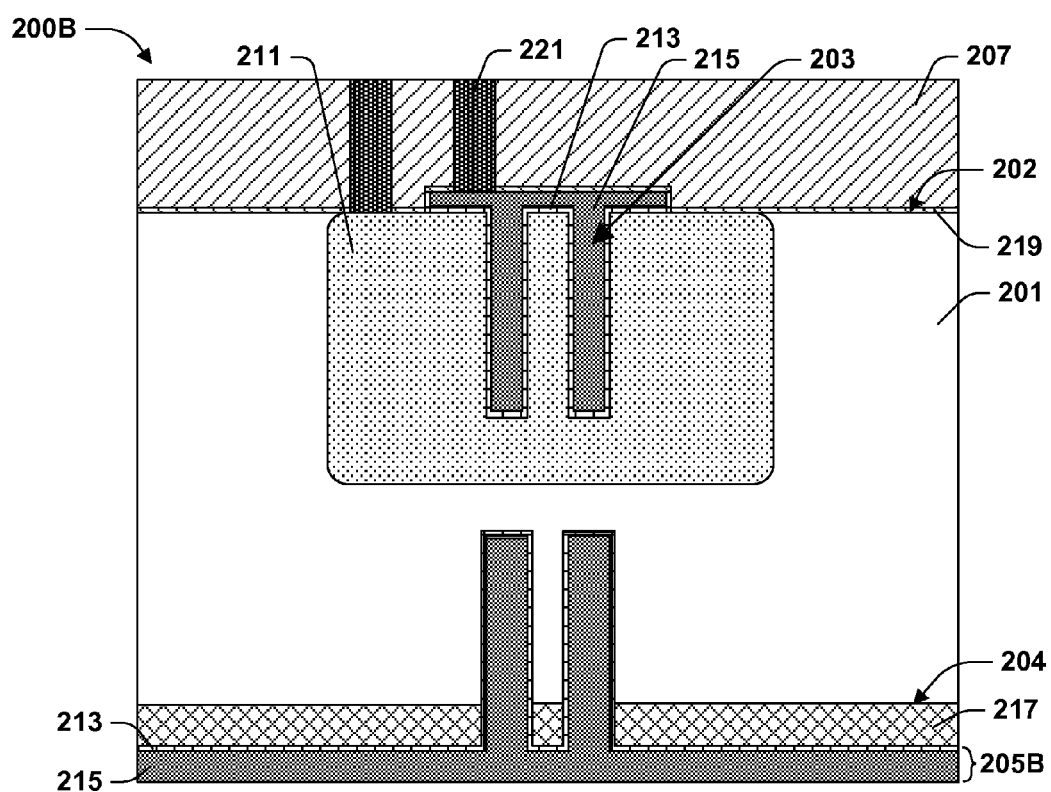

In some embodiments, the stress-inducing structures 205 are formed at least in part simultaneously with deep trench capacitors 203. In some of these embodiments, this is accomplished by applying the films 213 and 215 that fill the trenches 212 of the DTCs 203 to back side 204. In some embodiments, trenches 212 are filled to form DTCs 203 and trenches 214 are filled to form stress-inducing structures 205 simultaneously. This produces a stress-inducing structure 205B as shown for the example device 200B in FIG. 20. While the structures 205B appear similar to deep trench capacitors, in most embodiments the structures 205, even if of the form 205B, do not form any part of the circuitry of the device 200.

Figure 21:
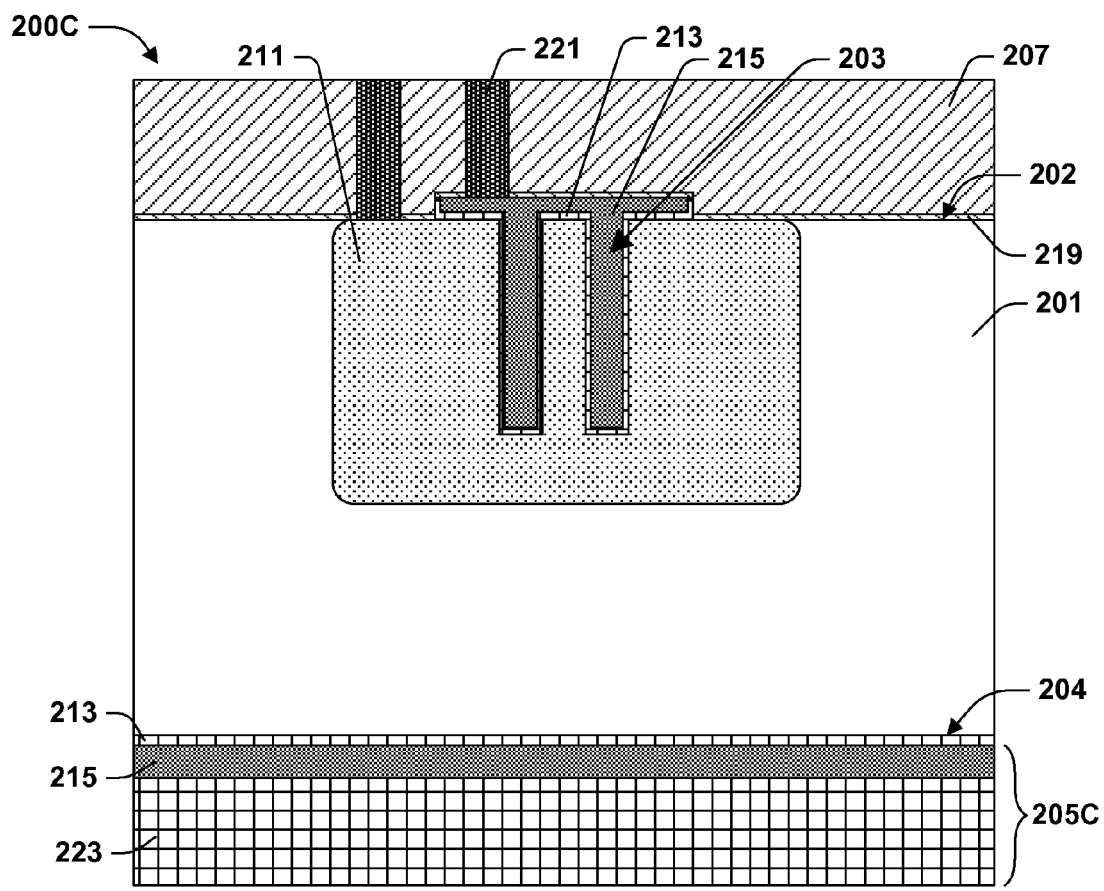

In some alternate embodiments, trenches are not formed on the back side 204 of the substrate 201. In these embodiments, the films 213 and 215 can coat the back side 204, but in general will not provide sufficient stress to of themselves adequately offset the warp caused by DTCs 203. In some embodiments, an additional tensile film 223 is formed over the back side 204 to complete the formation of the stress inducing structure 205. This is illustrated in FIG. 21 by the device 200C with the stress inducing structure 205C. In some embodiments, a tensile film 223 of sufficient thickness can sufficiently offset the stress caused by DTCs 203 whether or not any of the films 213 and 215 of the DTCs 203 are coated on the back side 223. In general, this requires a tensile film at least 1 μm thick. In most embodiments, this is a thicker film than any film of comparable material on the front side 202 of the substrate 201. Examples of tensile films include films of $SiO_2$, SiN, SiC, SiOC, and polysilicon.

In some embodiments, the device 200 is used within a 3D-IC device. Wafer warp can interfere with bonding and packaging, particularly if two or more components of a 3D-IC device are bonded before one or more of the wafers is diced. In some embodiments for which the structures and methods of the present disclosure are particularly suited, two wafers are packaged or bonded together before dicing.

In some embodiments, the 3D-IC device includes a high voltage or high power circuit. Even after both wafers have been diced, warping can be of particular concern in such devices. High voltage and high power circuits tend to undergo wide variations in temperature. Because warping arises from a mismatch in thermal expansion coefficients, a die within a 3D-IC device may warp and un-warp as temperature varies. Absent stress balancing structures provided by the present disclosure, the warping or un-warping may cause one of the dies to detach or delaminate from another die or structure within the 3D-IC device.

Figure 22:
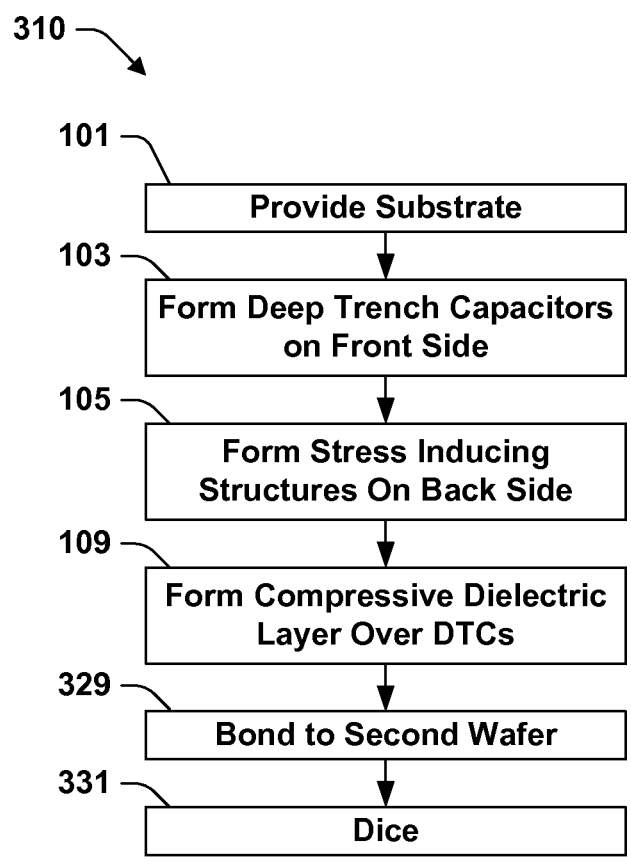
FIG. 22 is a flow chart for a process according to another embodiment of the present disclosure.

FIG. 22 provides a flow chart of a method 310 of forming a 3D-IC device according to some embodiments of the present disclosure. The process 310 includes act 101, providing a substrate 201 in the form of a wafer, act 103, forming deep trench capacitors 203 on the front face 202 of the wafer 201, and act 105, forming structures 205 having tensile stress on the back side 204 of the wafer 201. The dimensions of the structures 205, particularly the depths of trenches 214 if included, can be fined tuned to balance the front side stress. Act 109 is an optional part of method 310. Act 109 forms compressive films 207 over the DTCs 103. In some embodiments, the thickness of the films 207 are used to fine tune the balance between stresses on the front face 202 and the back side 204 of the wafer 201.

Act 329 is bonding the wafer 201 to a second wafer and act 331 is dicing the wafers. Bonding is facilitated when warp 206 is kept small. Nevertheless, a reduction in warping can be beneficial even after one or both wafers are diced. Accordingly, in some embodiments one or both wafers are diced prior to bonding 329.

Figure 23:
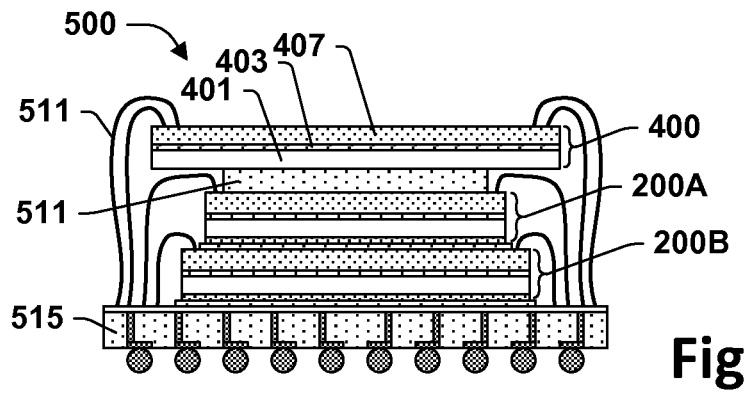
FIGS. 23-25 illustrate 3D-IC devices according to some embodiments of the present disclosure.

FIG. 23 provides an example of a 3D-IC device 500 that can be produced by the method 310. The device 500 is an example of wire-bonded 3D-IC devices provided by some embodiments of the present disclosure. The device 500 includes a high voltage or high power integrated circuit device 400 and one or more devices 200 that include DTCs 203 and backside stress-inducing structures 205. In the example of FIG. 23, the device 500 includes two such devices: devices 200A and 200B. Buffer layer 511 provides separation between devices 200B and 400. Devices 200A, 200B, and 400 are packaged together and connected by wires 511 to lead frame 515. The device 400 includes a semiconductor substrate 401, high voltage or high power devices 403, and a metal interconnect structure 407.

Figure 24:
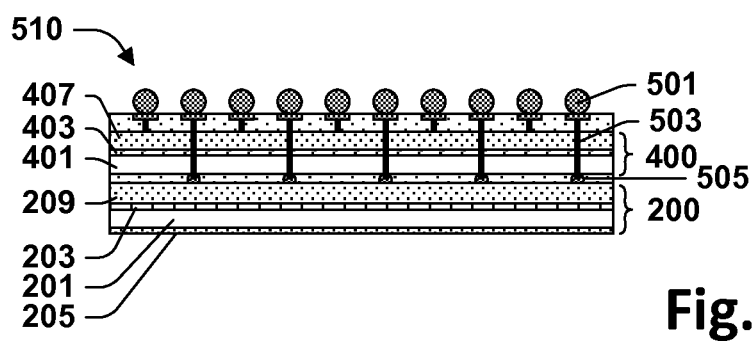

FIG. 24 provides an example of a 3D-IC device 510 that can be produced by the method 310. The device 510 is an example of 3D-IC devices provided by some embodiments of the present disclosure in which the components of the 3D-IC device are connected by through silicon vias (TSVs). The device 510 includes a high voltage or high power integrated circuit device 400 and a device 200 connected by TSVs 503. TSVs 503 pass through semiconductor substrate 401 and connect to solder bumps 505 of the metal interconnect structure 209 of the device 200. TSVs 503 can connect directly or through metal interconnect 407 of the device 400 to solder bumps 501. Solder bumps 501 are used to connect the 3D-IC device 510 to other devices. In some embodiments, the devices 200 and 400 are joined prior to dicing.

Figure 25:
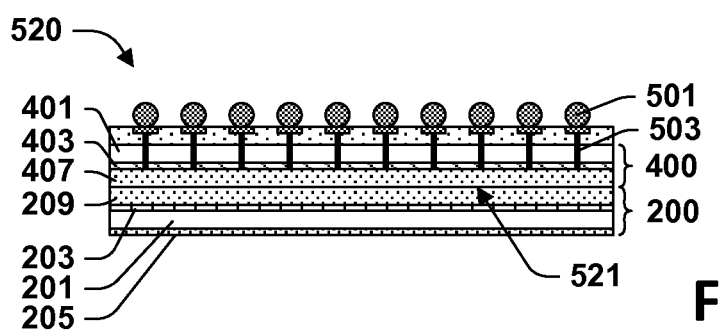

FIG. 25 provides an example of a 3D-IC device 520 that can be produced by the method 310. The device 520 is an example of 3D-IC devices provided by some embodiments of the present disclosure in which the components of the 3D-IC device are connected by direct wafer-to-wafer bonding. The device 520 includes a high voltage or high power integrated circuit device 400 and a device 200 that include DTCs 203 and backside stress-inducing structures 205. The metal interconnect structure 407 of the device 400 is connected directly to the metal interconnect structure 209 of the device 200 by any suitable direct connection method. Examples of direct connection methods that can be suitable include, for example, eutectic bonding, solder bonding, and thermo-compression bonding. TSVs 503 pass through either substrate 401 or substrate 201 to form connections between the metal interconnect structures 407 and 409 and solder bumps 501. Solder bumps 501 are used to connect the 3D-IC device 520 to other devices. In some embodiments, the devices 200 and 400 are joined prior to dicing.

The present disclosure provides an integrated circuit device that includes a semiconductor substrate having deep trench capacitors on a front side and stress-inducing structures on a back side. The stress-inducing structures on the back side include tensile materials that exert stresses on the substrate that counteract the stresses exerted by the deep trench capacitors. The structures on the back side include one or more tensile films that are thicker than any similar films on the front side or tensile materials filling trenches formed in the back side of the substrate.

The present disclosure provides a method of manufacturing an integrated circuit device that includes forming deep trench capacitors on a front side of a wafer and forming structures having tensile stress on the back side of the wafer. The structures on the back side exert stresses on the substrate that counteract the stresses exerted by the deep trench capacitors. The structures on the back side include one or more tensile films that are thicker than any similar films on the front side or tensile materials filling trenches formed in the back side of the substrate.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit, comprising:
    a semiconductor substrate having a frontside and a backside;
    frontside dielectric and conductive layers which are stacked over one another and configured to exert stress on the frontside of the semiconductor substrate; and
    backside dielectric and conductive layers which correspond in a one-to-one manner to the frontside dielectric and conductive layers and which have material compositions corresponding to those of the frontside dielectric and conductive layers, respectively, wherein at least one of the backside dielectric and conductive layers is configured to exert stress on the backside of the semiconductor substrate; and
    an additional backside layer exerting additional stress on the backside of the semiconductor substrate.

2. The integrated circuit of claim 1, wherein the frontside dielectric and conductive layers are disposed in trenches extending into the frontside of the semiconductor substrate.

3. The integrated circuit of claim 2, wherein the backside of the semiconductor substrate is a planar surface and wherein the backside dielectric and conductive layers are planar layers disposed on the planar surface of the backside of the semiconductor substrate.

4. The integrated circuit of claim 2, wherein the frontside dielectric and conductive layers comprise:
 a first frontside dielectric layer which directly abuts and lines sidewalls and bottom surfaces of the trenches and which extends continuously over the frontside of the semiconductor substrate between the trenches;
 a first frontside conductive layer extending continuously over the first frontside dielectric layer, the first frontside conductive layer disposed in the trenches and over the frontside of the semiconductor substrate between the trenches.

5. The integrated circuit of claim 1, wherein the frontside dielectric and conductive layers are stacked directly over one another and are configured to exert a first substrate-bowing stress on the frontside of the semiconductor substrate.

6. The integrated circuit of claim 5, wherein the backside dielectric and conductive layers are configured to exert a second substrate-bowing stress on the backside of the semiconductor substrate, the second substrate-bowing stress differing from the first substrate-bowing stress.

7. The integrated circuit of claim 6, wherein the additional backside layer is configured to exert an additional substrate-bowing stress on the backside of the semiconductor substrate to compensate for a difference between the first and second substrate-bowing stresses.

8. The integrated circuit of claim 1, wherein there is no layer over the frontside of the semiconductor substrate which has the same thickness and material composition as the additional backside layer.

9. An integrated circuit, comprising:
 a semiconductor substrate having a frontside and a backside;
 frontside dielectric and conductive layers which are stacked over one another and configured to exert a first substrate-bowing stress on the frontside of the semiconductor substrate; and
 backside dielectric and conductive layers which are configured to exert a second substrate-bowing stress on the backside of the semiconductor substrate, where a material composition of a backside conductive layer corresponds to a material composition of a frontside conductive layer; and
 an additional layer configured to exert an additional substrate-bowing stress on the frontside or backside of the semiconductor substrate to compensate for a difference between the first and second substrate-bowing stresses.

10. The integrated circuit of claim 9, wherein the first substrate-bowing stress tends to bow the frontside of the semiconductor substrate into a concave surface and tends to bow the backside of the semiconductor substrate into a convex surface.

11. The integrated circuit of claim 10, wherein the second substrate-bowing stress tends to reduce an extent of convexity of the convex surface and tends to reduce an extent of concavity of the concave surface.

12. The integrated circuit of claim 11, wherein the additional layer is disposed over the frontside dielectric and conductive layers and the additional substrate-bowing stress tends to further reduce the extent of convexity of the convex surface and tends to further reduce the extent of concavity of the concave surface.

13. The integrated circuit of claim 9, wherein the backside dielectric and conductive layers correspond in a one-to-one manner to the frontside dielectric and conductive layers, respectively.

14. The integrated circuit of claim 13, wherein the backside dielectric and conductive layers have material compositions corresponding to those of the frontside dielectric and conductive layers, respectively.

15. The integrated circuit of claim 9, wherein the frontside dielectric and conductive layers are disposed in trenches extending into the frontside of the semiconductor substrate.

16. The integrated circuit of claim 15, wherein the backside of the semiconductor substrate is a planar surface and wherein the backside dielectric and conductive layers are planar layers disposed on the planar surface of the backside of the semiconductor substrate.

17. An integrated circuit, comprising:
 a semiconductor substrate having a frontside and a backside, wherein trenches extend into the frontside of the substrate but the backside of the substrate is substantially planar;
 frontside dielectric and conductive layers which are stacked over one another and which are arranged in the trenches and are configured to exert a first substrate-bowing stress tending to make the frontside of the semiconductor substrate a concave surface; and
 backside dielectric and conductive layers which are configured to exert a second substrate-bowing stress on the backside of the semiconductor substrate to reduce the concavity of the concave surface, the second substrate-bowing stress differing from the first substrate-bowing stress due to the trenches extending into the frontside of the substrate while the backside is substantially planar; and
 an additional layer configured to exert an additional substrate-bowing stress on the frontside or backside of the semiconductor substrate to compensate for a difference between the first and second substrate-bowing stresses and further reduce the concavity of the concave surface.

18. The integrated circuit of claim 17, wherein the frontside dielectric and conductive layers are disposed in trenches extending into the frontside of the semiconductor substrate.

19. The integrated circuit of claim 17, wherein the backside of the semiconductor substrate is a planar surface and wherein the backside dielectric and conductive layers are planar layers disposed on the planar surface of the backside of the semiconductor substrate.

20. The integrated circuit of claim 17:
 wherein the frontside dielectric and conductive layers comprise:
  a first frontside dielectric layer which directly abuts and lines sidewalls and bottom surfaces of the trenches and which extends continuously over the frontside of the semiconductor substrate between the trenches;
  a first frontside conductive layer extending continuously over the first frontside dielectric layer, the first frontside conductive layer disposed in the trenches and over the frontside of the semiconductor substrate between the trenches; and
 wherein the backside dielectric and conductive layers comprise:

a first backside dielectric layer which has a composition and thickness corresponding to the first frontside dielectric layer; and a first backside conductive layer which has a composition and thickness corresponding to the first frontside conductive layer.

\* \* \* \* \*